US006685491B2

(12) United States Patent
Gergek

(10) Patent No.: US 6,685,491 B2
(45) Date of Patent: Feb. 3, 2004

(54) COMBINED CONNECTOR FOR FLUID AND ELECTRICAL CONNECTION

(76) Inventor: Frank Gergek, 55 West Beaver Creek Road Unit 14, Richmond Hill, Ontario (CA), L4B 1K5

(*) Notice: Subject to any disclaimer, the term of this patent is extended or adjusted under 35 U.S.C. 154(b) by 0 days.

(21) Appl. No.: 10/093,505

(22) Filed: Mar. 11, 2002

(65) Prior Publication Data

US 2002/0132505 A1 Sep. 19, 2002

Related U.S. Application Data

(60) Provisional application No. 60/275,704, filed on Mar. 15, 2001.

(51) Int. Cl.[7] .................................................. H10R 4/60

(52) U.S. Cl. ........................ 439/191; 439/192; 439/135

(58) Field of Search ................................. 439/191, 192, 439/135, 136, 142, 144, 358, 489, 490; 285/131, 137.1

(56) References Cited

U.S. PATENT DOCUMENTS

| | | | | | |
|---|---|---|---|---|---|
| 482,181 | A | * | 9/1892 | Kellom | 439/192 |
| 2,634,311 | A | * | 4/1953 | Darling | 439/191 |
| 2,942,226 | A | * | 6/1960 | Low | 439/296 |
| 3,184,703 | A | * | 5/1965 | Piscitello et al. | 439/335 |
| 3,235,834 | A | * | 2/1966 | O'Keefe et al. | 439/585 |
| 3,258,553 | A | | 6/1966 | Breslin | |
| 3,611,261 | A | * | 10/1971 | Gregory | 439/353 |
| 3,673,541 | A | * | 6/1972 | Volinskie | 439/195 |
| 4,063,790 | A | * | 12/1977 | Kleykamp et al. | 439/191 |
| 4,486,060 | A | * | 12/1984 | Currall | 439/191 |
| 4,517,404 | A | | 5/1985 | Hughes et al. | |
| 4,618,195 | A | | 10/1986 | Keane | 339/16 |
| 4,721,358 | A | * | 1/1988 | Faber et al. | 385/56 |
| 4,735,579 | A | | 4/1988 | Muser | |
| 4,758,170 | A | | 7/1988 | Hayden | |
| 4,840,547 | A | * | 6/1989 | Fry | 417/422 |
| 5,004,428 | A | | 4/1991 | Hayden | |
| 5,197,895 | A | * | 3/1993 | Stupecky | 439/194 |
| 5,349,146 | A | | 9/1994 | Radabaugh | |
| 5,387,117 | A | | 2/1995 | Moyher, Jr. et al. | |
| 5,886,299 | A | | 3/1999 | Ward | |
| 5,997,320 | A | * | 12/1999 | DeMello | 439/148 |

FOREIGN PATENT DOCUMENTS

| | | | |
|---|---|---|---|
| DE | 37 26 778 | 3/1989 | H01R/13/62 |
| EP | 0 315 924 | 5/1989 | H01R/13/66 |

* cited by examiner

*Primary Examiner*—Tho D. Ta
*Assistant Examiner*—Larisa Tsukerman
(74) *Attorney, Agent, or Firm*—Ogilvy Renault

(57) ABSTRACT

A combined connector assembly provided for quick, secure fluid and electrical connection includes a socket assembly and plug assembly. The socket assembly can be supported on various structures as a wall outlet or an appliance attachment by means of an adapter assembly. Interlocking means are incorporated with electrical contacts between socket and plug assemblies so that the fluid and electrical connection between the socket and plug assemblies can be quickly and securely established, eliminating the risk of accidental detachment of the plug assembly from the socket assembly. Seals and covers are provided to prevent fluid leakage from the assembly in both connected and disconnected positions. The combined connector assembly of the present invention can be advantageously used to connect an appliance to a water supply and drain system which pumps water to and removes water under vacuum from the appliance through a single hose in a pre-programmed manner.

19 Claims, 16 Drawing Sheets

COMBINED CONNECTOR FOR FLUID AND ELECTRICAL CONNECTION

CROSS-REFERENCE TO RELATED APPLICATIONS

This application claims the benefit of the Applicant's U.S. provisional patent application No. 60/275,704, filed on Mar. 15, 2001.

FIELD OF THE INVENTION

The present invention relates to combined connectors for fluid and electrical connection, and is more particularly directed to a combined connector which can be quickly and securely connected to establish both fluid and electrical connections.

BACKGROUND OF THE INVENTION

In the prior art, connector assemblies used for both fluid and electrical connection are well known and are especially popular for use with central vacuum systems. A central vacuum cleaner system installed in a house typically includes a vacuum source and dirt collection apparatus in a central location, connected by duct work to vacuum cleaner wall outlets located strategically throughout the house. Each vacuum cleaner outlet includes a vacuum port which communicates with the duct work in the wall and with the fluid passage of the hose to provide suction cleaning air to the attachment at the other end of the hose. Each outlet also typically includes two contacts to low voltage control conductors for actuating the central vacuum cleaner system and/or a high voltage electrical receptacle as part of the outlet assembly for connection with a power cord integrated with the hose. Thus, power and suction can be delivered to a power head at the other end of the integral hose and power cord.

Examples of connectors for both fluid and electrical connection used in central vacuum cleaning systems are described in U.S. Pat. No. 3,258,553, issued to Breslin on Jun. 28, 1966, U.S. Pat. No. 4,735,579, issued to Muser on Apr. 5, 1988. U.S. Pat. No. 4,758,170, issued to Hayden on Jul. 19, 1988, U.S. Pat. No. 5,004,428, issued to Hayden on Apr. 2, 1991, U.S. Pat. No. 5,349,146, issued to Radabaugh on Sep. 20, 1994, U.S. Pat. No. 5,387,117, issued to Moyher, Jr. et al. Feb. 7, 1995 and U.S. Pat. No. 5,886,299, issued to Ward on Mar. 23, 1999.

The connectors for both fluid and electrical connection described in those United States patents generally include aggregation of an individual electrical connector and an individual fluid connector which do not provide additional and/or interactive functions. Furthermore, those connectors specifically provide neither sealing means for the fluid connection, nor mechanical locking means to assure the fluid and electrical connection. Air leakage of those connectors for central air cleaning systems and accidental disconnection of those connectors from the central vacuum cleaning systems do not result in serious problems except for low work efficiency and disruption of operation, respectively.

Those connectors for both fluid and electrical connection used for central vacuum cleaning systems as described in the prior art are not adapted to be used for completing an electrical circuit for controlling liquid fluid flow through the connector. Leakage of liquid from the connector usually causes environmental problems and can further adversely affect the electrical connection established by this connector. Needless to say, accidental disconnection of a liquid fluid pipe would be a serious environmental problem and not acceptable. Therefore, there is a need for a combined connector for fluid and electrical connection which overcomes the above-mentioned shortcomings of the prior art.

SUMMARY OF THE INVENTION

One object of the present invention is to provide a combined connector assembly for fluid and electrical connection.

Another object of the present invention is to provide a combined connector assembly for secure fluid and electrical connection, minimizing the risk of accidental disconnection.

In accordance with one aspect of the present invention, a combined connector assembly is provided for fluid and electrical connection. The combined connector assembly comprises a socket assembly, a plug assembly and means for releasably interlocking the plug assembly and the socket assembly in the connected position. The socket assembly includes a socket body which has a first end, a second end, and a fluid passage extending through the socket body and forming first and second openings in the respective first and second ends. The socket assembly further includes a plurality of metal contacts affixed to the socket body and adapted to be connected to a first external circuit. The plug assembly includes a plug body which has a first end, a second end, and a fluid passage extending through the plug body and forming first and second openings in the respective first and second ends. The first end of the plug body is detachably, sealingly received in the first opening of the socket body, thereby selectively providing fluid communication of the fluid passage of the socket body with the fluid passage of the plug body. The plug assembly further includes a plurality of metal contacts positioned on the plug assembly and adapted to be connected to a second external circuit. The means for releasably interlocking the plug assembly and the socket assembly includes a first part incorporated with the metal contacts affixed to the socket assembly and a second part incorporated with the metal contact positioned on the plug assembly. The contacts of the socket body and the contacts of the plug body are in contact only when the first part engages the second part.

The socket body preferably comprises at least one cavity at a side thereof and the metal contacts of the socket assembly are affixed within the cavity. The plug body preferably comprises at least one lock member having an inwardly extending protrusion at an end thereof and the metal contacts of the plug assembly are positioned on the protrusion. Thus, the contacts of the plug assembly are pressed into contact with the contacts of the socket assembly when the protrusion of the lock member under a resilient force is engaged in the cavity of the socket body.

In one embodiment of the present invention, the combined connector assembly further comprises an adapter assembly connected to the second end of the socket body which is adapted to be affixed to various structures, for supporting the socket assembly and for providing fluid communication of the fluid passage of the socket body with an external fluid pipe. The combined connector assembly according to this embodiment of the invention further comprises a first cover assembly for sealingly closing the first opening of the socket body and covering the metal contacts of the socket body when the plug assembly is detached from the socket assembly.

The combined connector assembly of the present invention advantageously provides a quick and secure connection for both fluid passages and electrical conductors so that fluid leakage is minimized and accidental disconnection is prevented. These features are advantageous, especially when the fluid delivered through the combined connector assembly is a liquid such as water. The combined connector assembly of the present invention has various applications and is particularly useful for a central watering system which is described in the Applicant's co-pending United States patent application entitled REMOTE CONTROLLED WATER FLOW AND DRAIN SYSTEM, filed on the same filing date of this patent application, and for flower pots used in the implementation of a flood and drain watering method which are described in the Applicant's co-pending United States patent application entitled METHOD AND APPARATUS FOR WATERING POTTED PLANTS, filed on the same filing date of this patent application.

In order to understand the essential function of the combined connector of the present invention when it is used with the central watering system, the system is briefly described below. Similar to a central vacuum cleaning system, this central watering system has fluid distribution pipes built into a house structure with outlets at various indoor or outdoor locations. A central hydro-electrical unit with a main controller will supply or withdraw water through the pipes from a flower pot when this flower pot is connected by a hose to one of the outlets of the system. In accordance with a flood and drain watering method, the central watering system first pumps water into this flower pot to flood the soil therein and then vacuum-removes water not absorbed by the soil in response to electric signals sent by sensors of the flower pot and a remote controller. The combined connector of the present invention can be used both as a wall outlet connection and as an appliance attachment connection.

Other features and advantages of the present invention will be better understood with reference to preferred embodiments described below.

BRIEF DESCRIPTION OF THE DRAWINGS

Having thus generally described the nature of the present invention, reference will now be made to the accompanying drawings, showing by way of illustration the preferred embodiments thereof, in which.

DETAILED DESCRIPTION OF THE PREFERRED EMBODIMENT

Figure 1A:
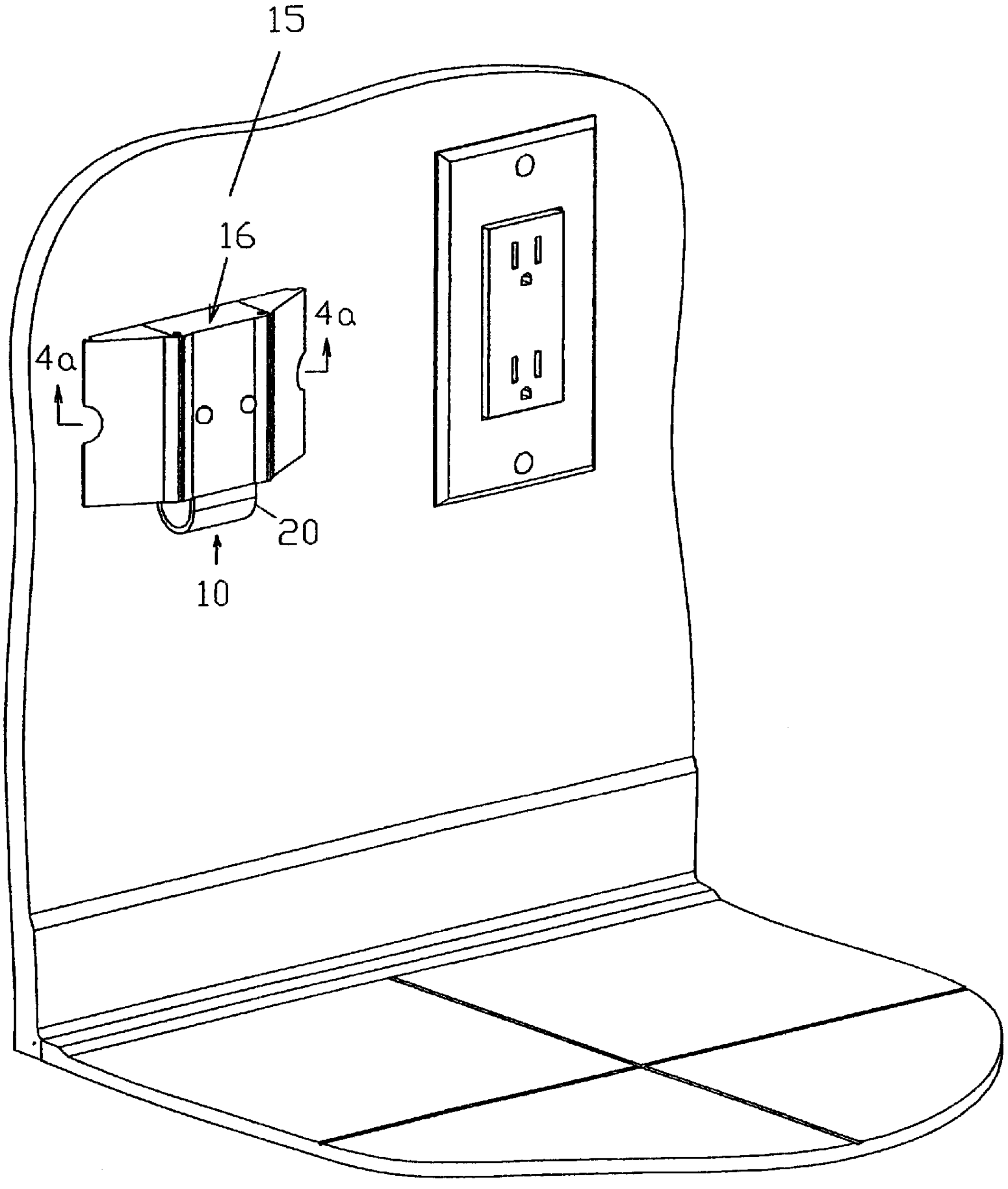
FIG. 1*a* is a perspective view showing a socket assembly of a combined connector assembly according to one embodiment of the present invention installed in a floor position in a wall, the combined connector assembly being closed by its cover assembly.
Figure 1B:
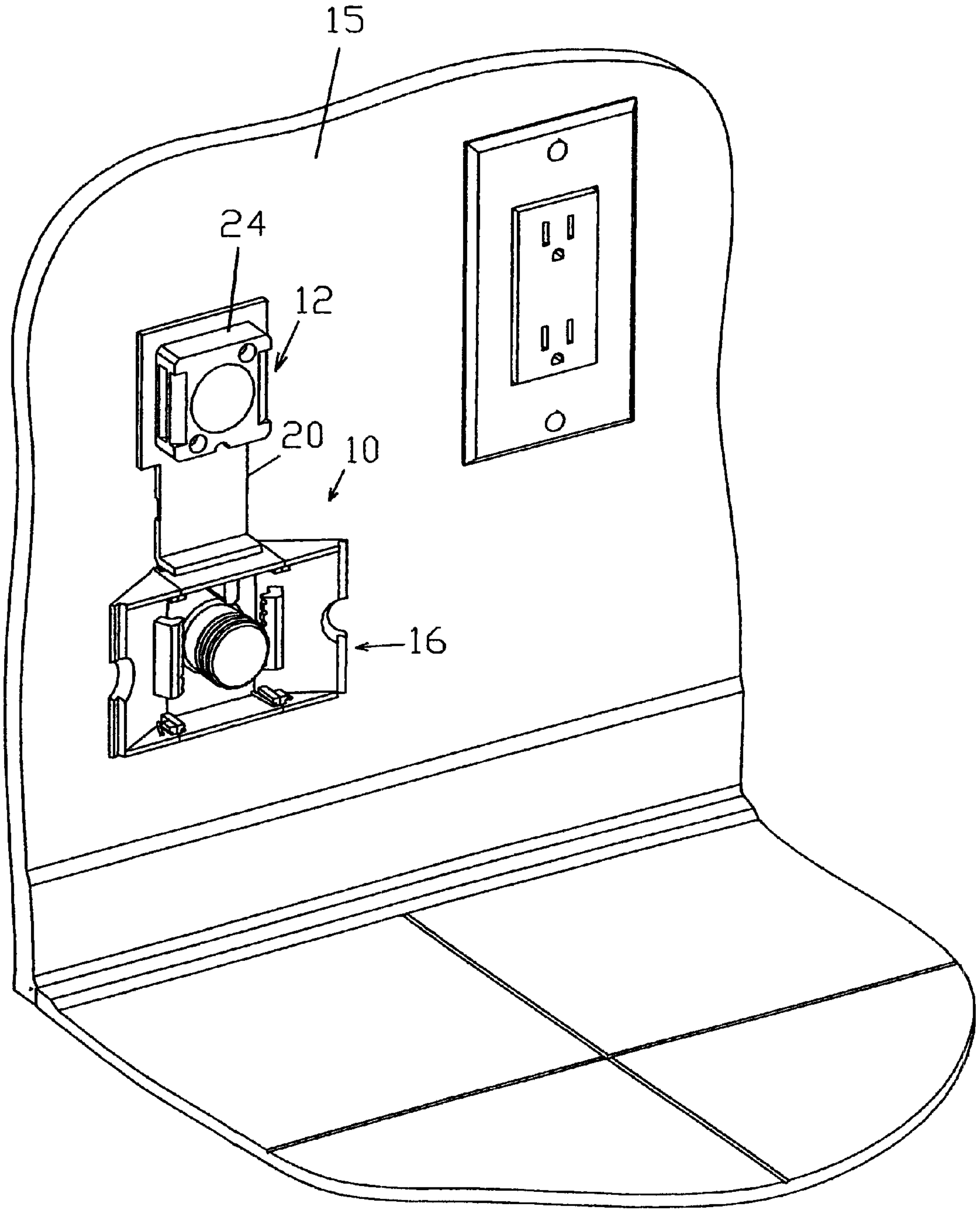
FIG. 1*b* is a perspective view showing the socket assembly of the embodiment in FIG. 1*a* with its cover assembly in the open position.
Figure 1C:
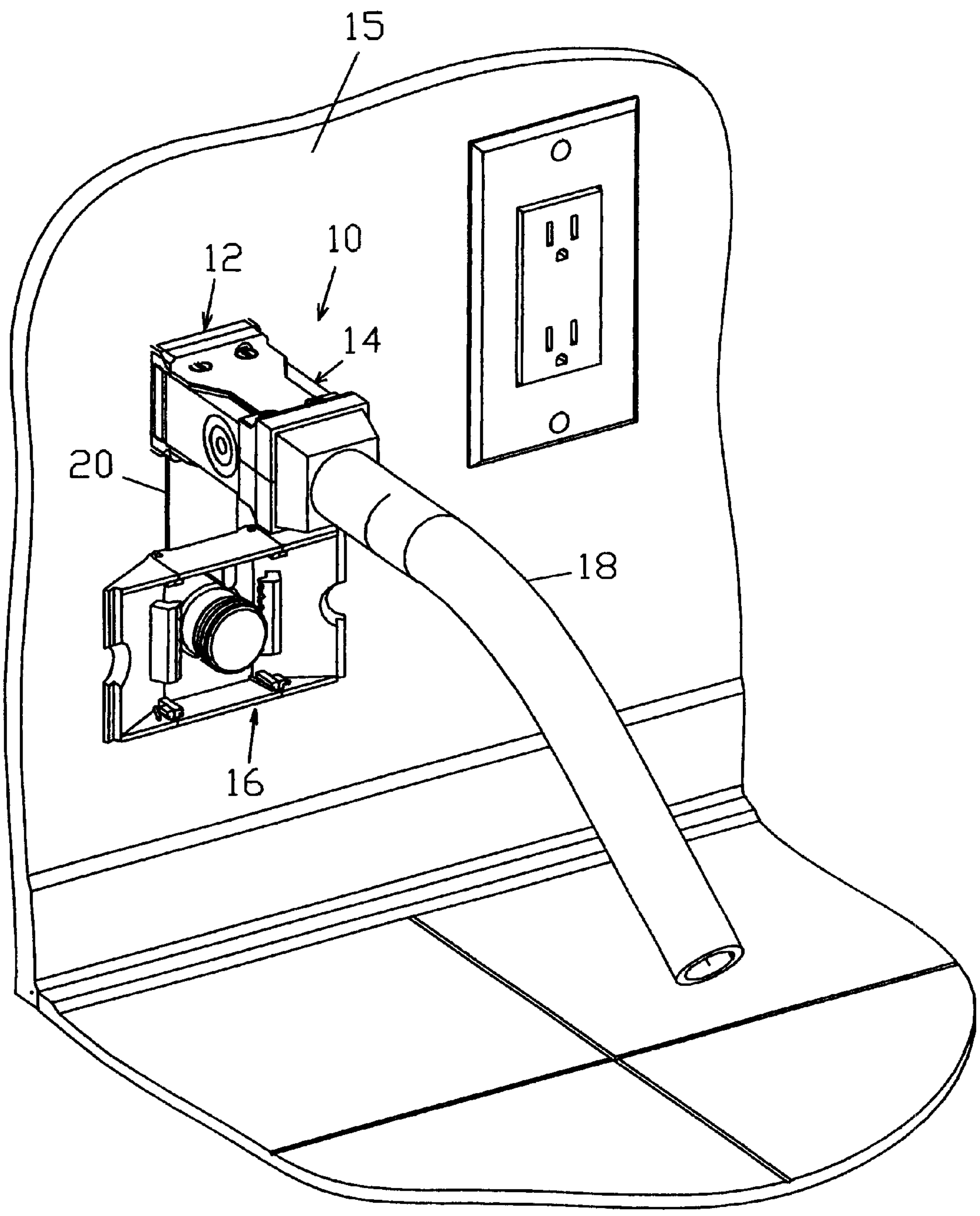
FIG. 1*c* is a perspective view showing the socket assembly of the embodiment in FIG. 1 connected with a plug assembly of this embodiment.

The combined connector assembly in accordance with one embodiment of the present invention is illustrated in the drawings, particularly in FIGS. 1*a* to 1*c*, and is generally indicated by numeral 10. The combined connector assembly 10 which forms a wall outlet connection includes a socket assembly 12, a plug assembly 14 and a wall cover assembly 16. The socket assembly 12 is installed in a wall panel 15, for example, in a floor position close to an electric power outlet. The plug assembly 14 is attached to an end of a hose 18 the other end of which is to be connected to an appliance so that fluid such as water can be pumped from a source through the combined connector assembly 10 and the hose 18 to the appliance, or water can be withdrawn from the appliance under a vacuum action through the same water passage. The cover assembly 16 is attached to and suspends from the socket assembly 12 by way of a flexible apron member 20 and is used to cover the socket assembly 12 when the plug assembly 14 is disconnected and removed from the socket assembly 12.

Reference will now be made to FIGS. 2 and 3*a*–3*c*. The socket assembly 12 includes a socket body 22 having a square head 24 at a first end thereof and a cylindrical nozzle 26 at a second end thereof. A fluid passage 28 extending through the socket body 22 forms central openings 30 and 32 in the respective head 24 and the nozzle 26. The nozzle 26 is provided with one or more O-rings 34 near the opening 32.

The square head 24 includes two elongate cavities 36 on two opposite sides thereof. Two slanted surfaces 37 are provided at the front edges of the opposite sides. At the bottom of each cavity 36 there are metal electrical contacts 38. A back section 40 of each contact 38 is affixed in a hole 42 which extends through a back wall of the cavity 36 so that the back section 40 is exposed to be connected to a wire of an electrical cable 42*a* which is in turn connected to an electrical connector 44*a*. A front section 46 of each contact 38 is loosely supported in the cavity 36 and can bend elastically when pressed by an external force. At the bottom of the square head 24 there is a key way 48 that permits the plug assembly 14 of FIG. 1*c* to be inserted only with the proper angular orientation to the socket body 22.

An internal socket 50 is secured to a wall stud 52 for supporting the socket assembly 12. The internal socket 50 also functions as an adapter so that the socket assembly 12 can be attached to various structures and connected to external fluid passages in various positions through different types of internal sockets 50, which will be further described hereinafter with reference to FIGS. 6*a* to 6*c*.

The internal socket 50 generally includes a square body 54 with hole 56 for sealingly receiving the nozzle 26 of the socket assembly 12. At the bottom of the square body 54 there is a hollow cylindrical extension 58 that allows attachment to a hose 60 of a central watering system (not shown). A fluid passage (not shown) extends from the opening 56 through the square body 54 to the cylindrical extension 58 so that water can flow through the internal socket 50 and the socket body 22 when the nozzle 26 of the socket assembly 12 is sealingly received in the opening 56 of the internal socket 50. The cable 42*b* which is connected to an electrical circuit of the central watering system is terminated with the electrical connector 44*b*. The electrical connector 44*b* is connected to the electrical connector 44*a* of the socket assembly 12. The cable 42*b* on the electrical connector 44*b* is attached by a hook for example (not shown), to the side of the square body 54 in order to prevent falling thereof when the electrical connector 44*b* is disconnected from the electrical connector 44*a*.

The internal socket 50 is attached to the side of the stud 52 in the wall by two screws 62. Alternatively, an L-shaped bracket (not shown) can be placed between the internal socket 50 and the side of the stud 52 so that the internal socket 50 is attached to the bracket by means of screws 60 and the bracket is in turn attached to the front of the stud 52 by screws (not shown) through its bent section.

The distance between the front of the internal socket 50 and the front of the stud 52 is predetermined in accordance with the dimensions of the socket assembly 12, to ensure that the square head 24 of the socket assembly 12 is appropriately attached to the exterior surface of a wall panel 15, as shown in FIG. 1*b*. The internal socket 50 includes two threaded bores 64 in the front of the square body 54 for receiving mounting screws 66 which extend through mounting bores 68 in the square head 24 of the socket assembly 12. A split sleeve spacer 70 is provided to surround the nozzle 26 in order to ensure the proper position of the socket assembly 12 to the internal socket 50.

When the wall panel 15 is in place with holes (not shown) for mounting the socket assembly 12, the electrical connector 44*b* is first pulled out from the wall using a hook (not shown) and is then connected with the electrical connector 44*a* of the socket assembly 12. The socket assembly 12 is then pressed into the internal socket 50. The two mounting screws 66 of the in the square head 24 are then firmly secured in the corresponding two threaded bores 64 of the front of the body 54. The length of the split spacer 70 is critical. When the screws 66 are tightened, the pressure must be on the split spacer 70 and not on the wall panel. The split spacer 70 can be easily replaced if necessary without removing the O-rings 34, by simply pulling the split spacer 70 apart.

Figure 4B:
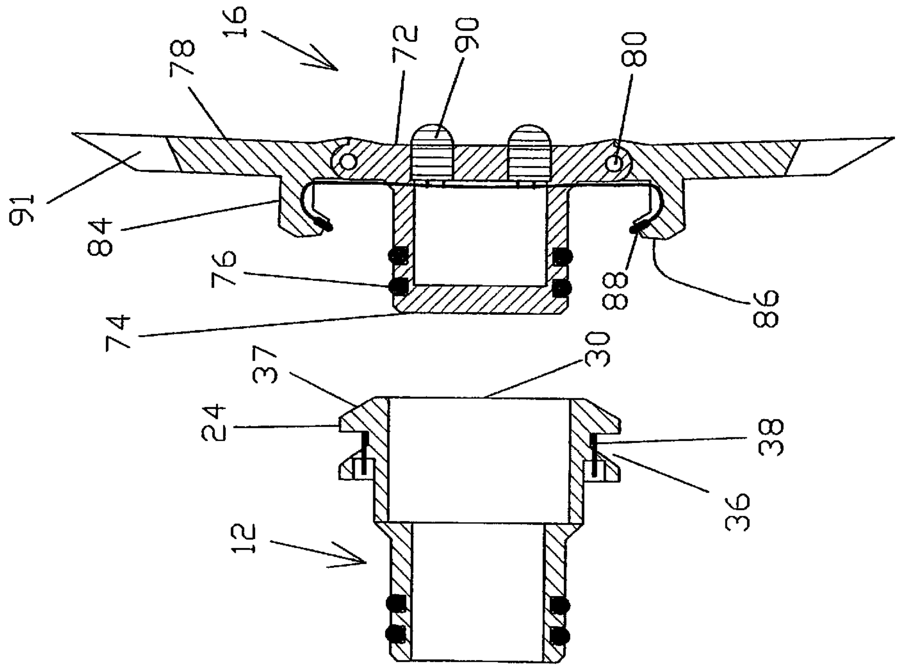
FIG. 4*b* is a similar view of the socket assembly of FIG. 4*a*, with its cover assembly removed therefrom.
Figure 4A:
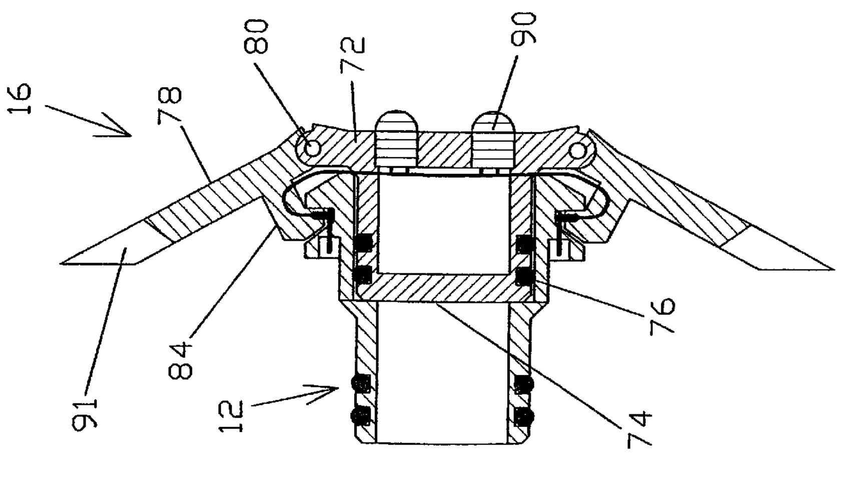
FIG. 4*a* is a cross-sectional view of the socket assembly with its cover assembly in a closed position, taken along line 4*a*—4*a* of FIG. 1*a;*
Figure 4C:
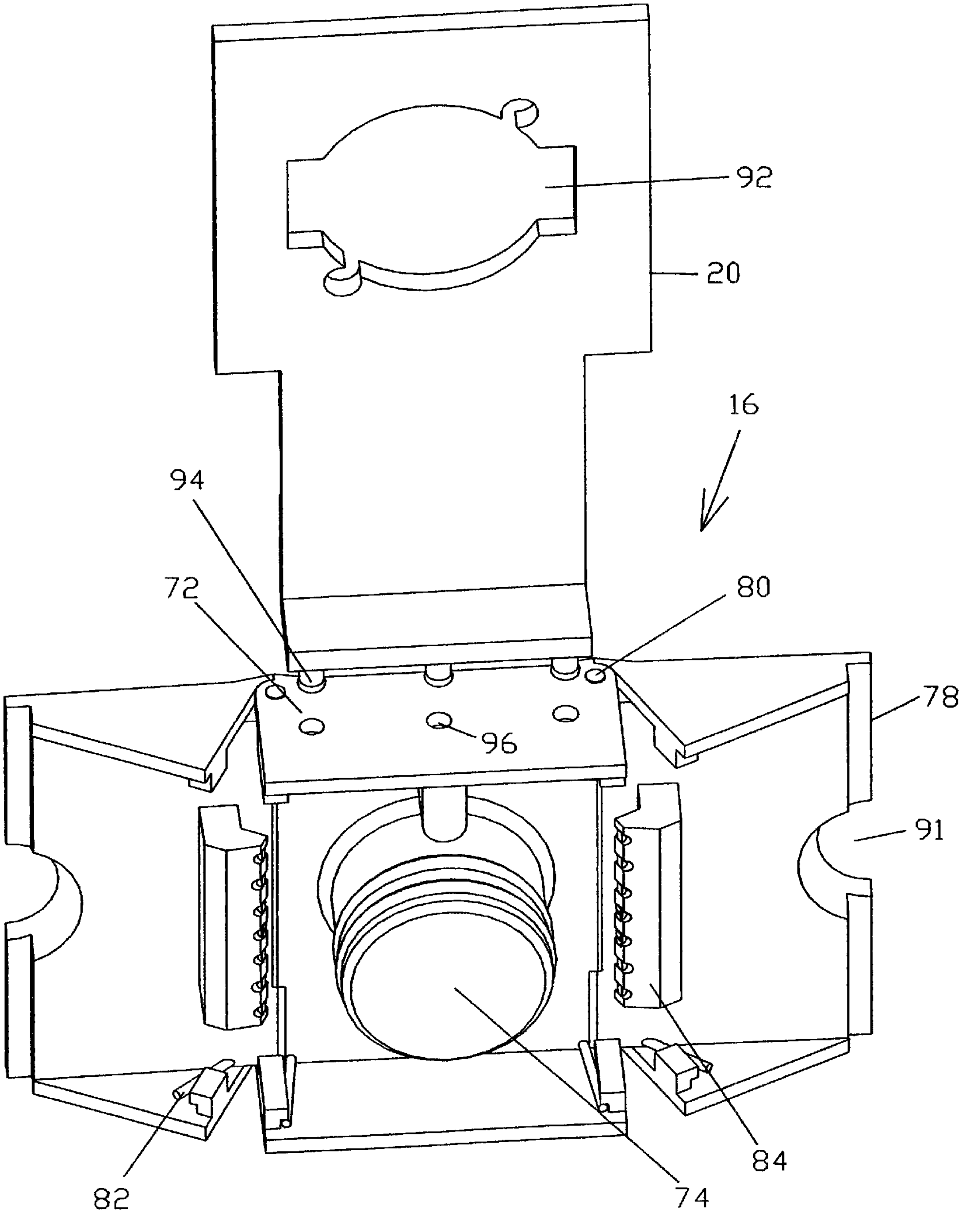
FIG. 4*c* is perspective view of the cover assembly.

Referring now to FIGS. 1*a*, 1*b* and FIGS. 4*a*–4*c*, the wall cover assembly 16 has a body 72 with a cylindrical plug 74 at the center thereof. The cylindrical plug 74 has O-rings 76 to make a watertight seal when the cylindrical plug 74 is inserted into the central opening 30 of the socket assembly 12. Two wings 78 are attached through hinges 80 to the body 72 on opposite sides thereof. Each wing 78 is urged into a closed position as shown in FIG. 4*a*, by two springs 82 positioned at the ends of each hinge 80. On the inside of each wing 78 is affixed a lock member 84 having an inwardly extending protrusion 86 at the end thereof. Metal electrical contacts 88 are attached to each protrusion 86.

A number of the metal electrical contacts 88 are connected to indicating lights 90 that are installed in the body 72 at the front thereof. When the plug 74 is inserted into the center opening 30 of the socket assembly 12, the wings 78 are urged by the springs 82, to pivot laterally towards the head 24 of the socket assembly 12 until the lock members 84 are engaged with the respective cavities 36. The slanted surfaces 37 on the front edges of the opposite sides of the head 24 facilitate the engagement of the lock members 84 with the cavities 36. When the lock members 84 are engaged with the cavities 36, the metal electrical contacts 38 in the cavities 36 are in firm contact with the metal electrical contacts 88 on the protrusions 86 so that the indicating lights 90 can be selectively illuminated in various illumination models to indicate for example, that the wall cover assembly 16 is properly closed, that the central watering system is being used through another outlet, that it is due to water plants through this outlet, etc. Additionally, a number of the metal electrical contacts 88 from opposite wings 78 are connected together to complete an electrical interlock circuit of the central watering system. Two recesses 91 provided at the end of the respective wings 78, permit a user to insert his/her fingers to pull back the wings 78 when the wall cover assembly 16 is to be unplugged from the socket assembly 12.

Figure 2:
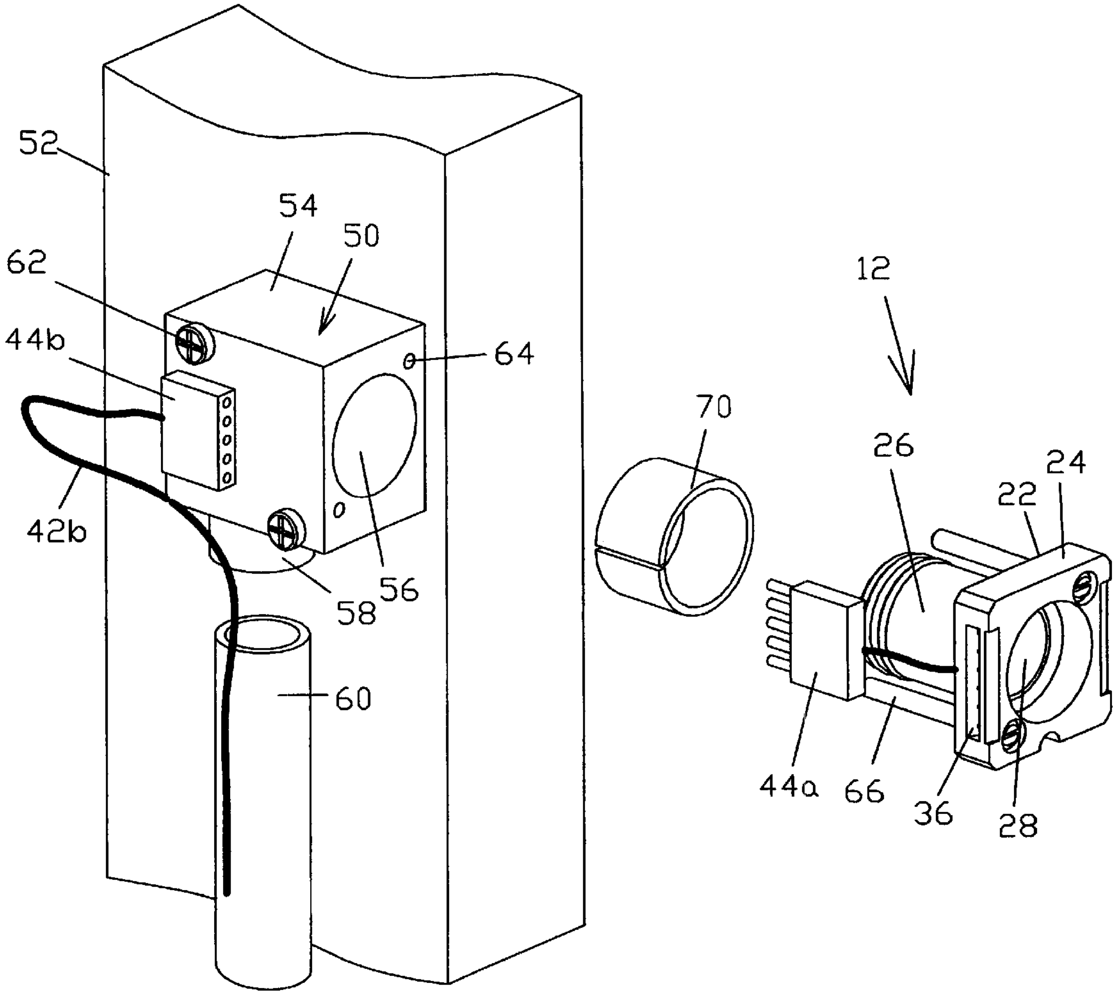
FIG. 2 is a exploded perspective view of the socket assembly of the embodiment in FIG. 1*a*, the wall panel being removed to show the socket assembly supported by an internal socket assembly.
Figure 3A:
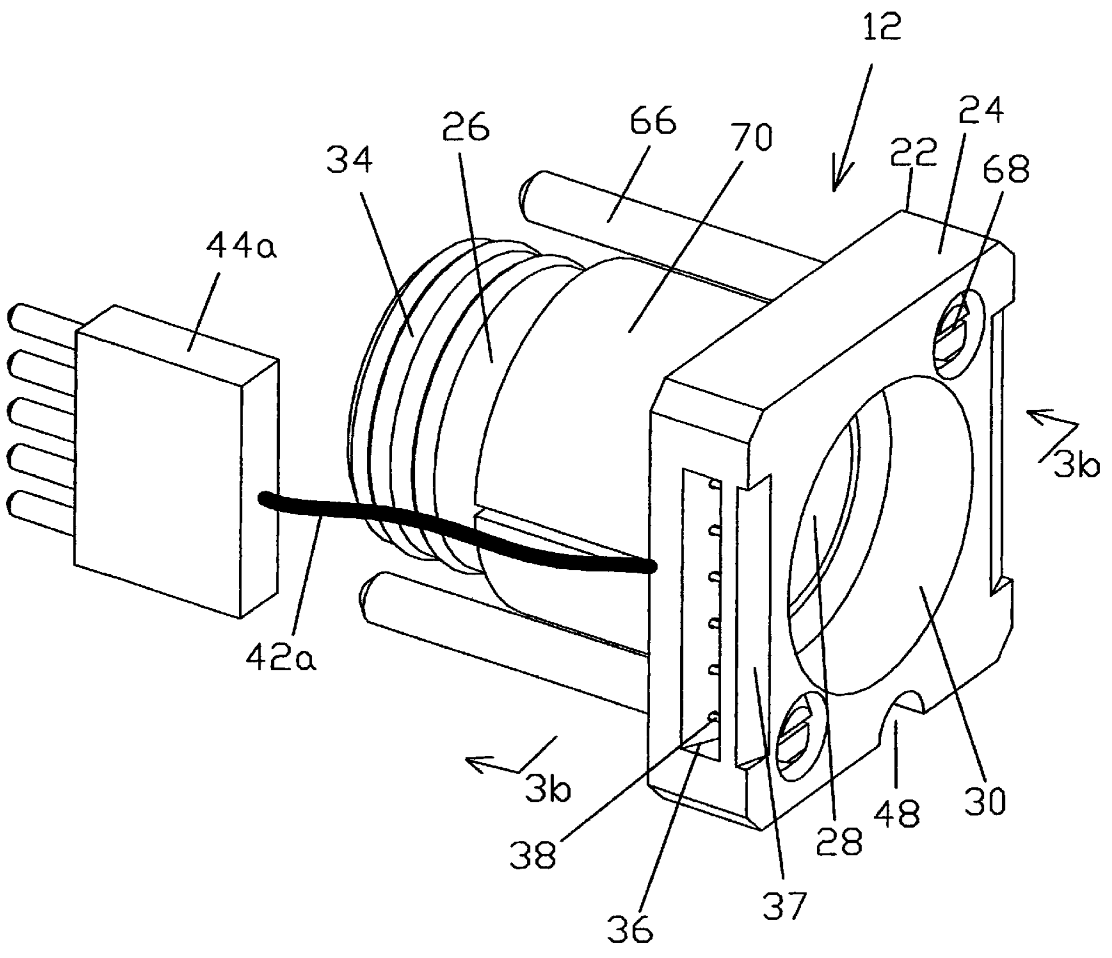
FIG. 3*a* is an enlarged perspective view of the socket assembly of FIG. 2 showing the details thereof.
Figure 3B:
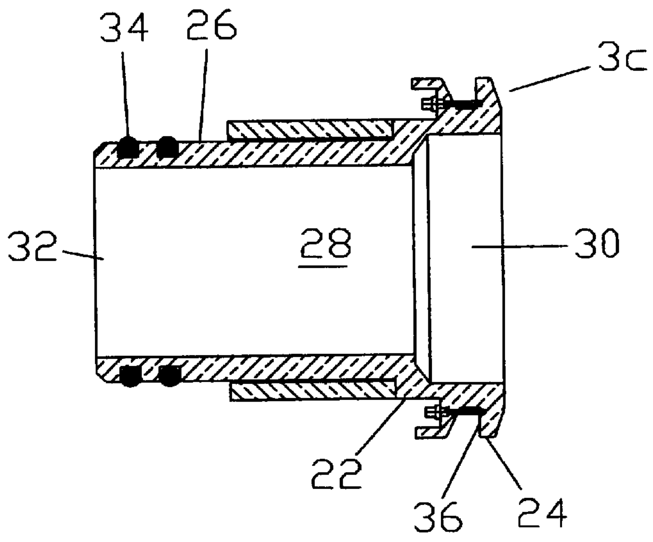
FIG. 3*b* is a cross-sectional view taken along line 3*b*—3*b* of FIG. 3*a;*
Figure 3C:
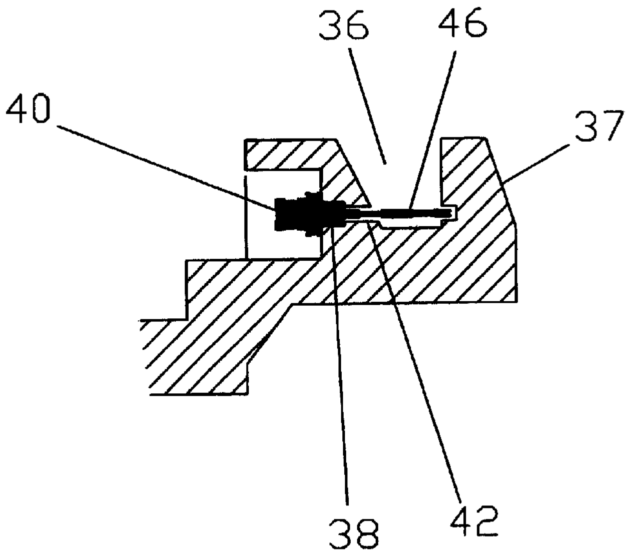
FIG. 3*c* is an enlarged, partial cross-sectional view of area 3*c* of FIG. 3*b*, showing the detail of a metal contact affixed to the socket assembly of FIG. 3*b;*

The apron 20 formed of a semi-soft material with an opening 92 to accommodate the nozzle 26, screws 66 and cable 42*a* of the socket assembly 12 of FIG. 3*a*, is placed between the socket assembly 12 and the wall panel and is attached at its bottom end to the top of the body 72 of the wall cover assembly 16 by well-known means, such as bosses 94 snuggly received in holes 96 in the top of the body 72. The apron 20 has an adequate length so that the wall cover assembly 16 suspends from the socket assembly 12 as shown in FIG. 1*b* and can be easily positioned to close the socket assembly 16 as shown in FIG. 1*a*. The apron 20 properly covers the hole cut in the wall panel for receiving the socket assembly 12. The apron 20 is larger than the square head 24 of the socket assembly 12 so that the hole in the wall panel does not need to be cut precisely. Additionally, the apron 20 will keep any water drops away from the wall. A few water drops may occur during the connection change of the socket assembly 12, from the plug assembly 14 as shown in FIG. 1*c* to the wall cover assembly 16 as shown in FIG. 1*a*, even though the central watering system is generating a suction to remove water remaining in the water hose 60 of FIG. 2.

Referring now to FIGS. 1*c* and 5*a*–5*d*, the plug assembly 14 includes a hollow plug body 98 having a flat top 100, a flat bottom 102 and opposite flat sides 104 with a cylindrical nozzle 106 at the front end and cylindrical extension 108 at the rear end thereof. A fluid passage 110 extends through the plug body 98, forming openings 112, and 114 in the respective nozzle 106 and extension 108. O-rings 116 around the nozzle 106 provide a fluid-tight connection with the socket assembly 12 when the nozzle 106 is inserted into the opening 30 of the socket body 22. The cylindrical extension 108 is adapted to be connected to the hose 18 which is secured to the extension 108 by a hose retainer 118 well known in the art. The front end 120 of the nozzle 106 is beveled to facilitate the insertion of the nozzle 106 into the opening 30 of the socket body 22.

Figure 5A:
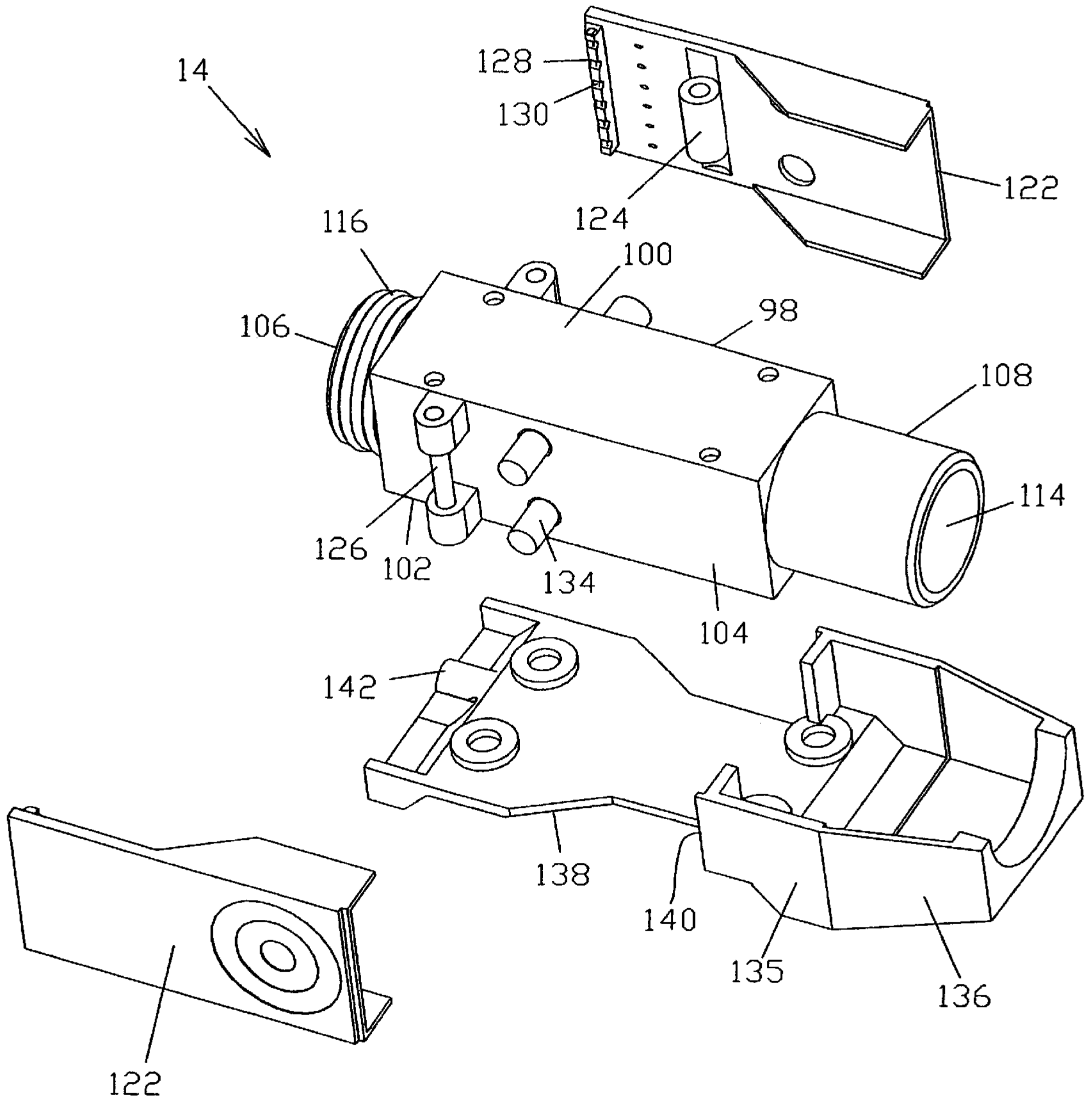
FIG. 5*a* is an exploded perspective view of the plug assembly with a top cover omitted.
Figure 5B:
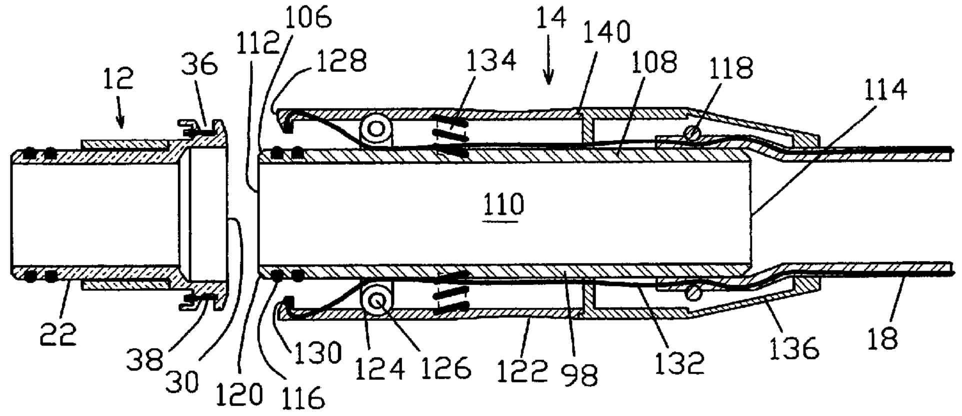
FIGS. 5*b*–5*d* are cross-sectional views of the socket assembly and plug assembly of FIG. 1*c*, showing various relative positions thereof during a connection procedure.
Figure 5C:
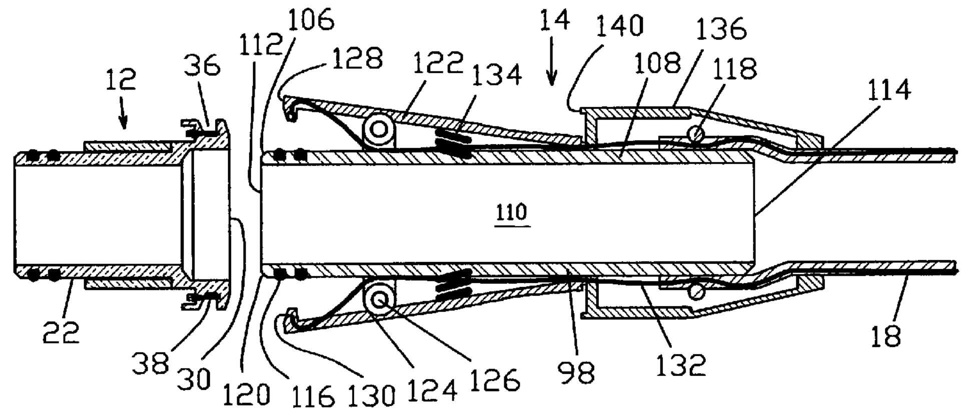
Figure 5D:
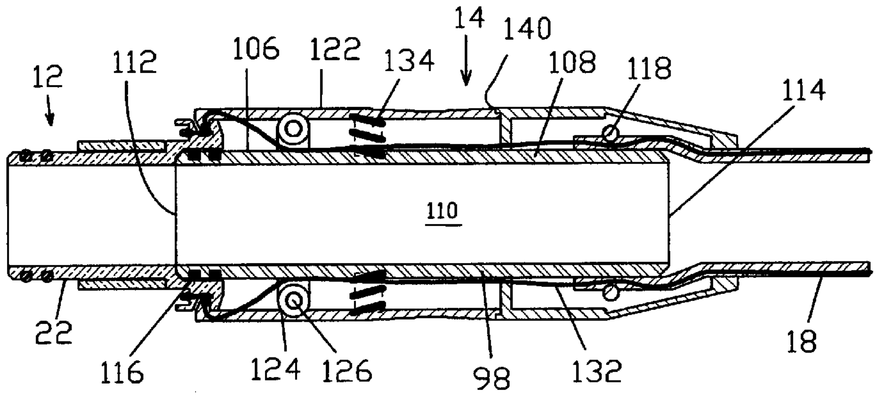

Two handles 122 are provided on the opposite sides 104 of the plug body 98. A hinge sleeve 124 is affixed to the inner side at the middle of each handle 122. The hinge sleeves 124 are pivotally mounted on two hinge pins 126 securely attached to the opposite sides 104 of the plug body 98, so that the handles 122 can pivot about the hinge pins 126, respectively. A protrusion 128 extends inwardly from the front end of each handle 122, on which a plurality of metal electrical contacts 130 are attached. A number of these metal electrical contacts 130 are connected to wires 132 which may be incorporated into the hose 18 and is to be connected together with the hose 18, to an appliance. Optionally, some of these metal electrical contacts 130 can be left without connection to the wires 132, or can be connected with one another, depending on specific applications. Springs 134 are positioned between the plug body 98 and the respective handles 122. The handles 122 can be pressed pivotally open as shown in FIG. 5*c* for the insertion of the nozzle 106 of the plug assembly into the opening 30 of the socket body 22, and can be urged to pivot laterally so that the protrusions 128 move inwardly to engage the cavities 36 of the socket assembly 12 when the nozzle 106 of the plug assembly 14 is inserted into the opening 30 of the socket assembly 12, as shown in FIG. 5*d*. The metal electrical contacts 130 on the handles 122 are pressed into contact with metal electrical contacts 38 in the cavities 36. Thus, electrical connections of cable 42*a*, 42*b* of FIG. 2 with wires 132 is established.

The plug assembly 14 further includes top and bottom cover members 135 (only the bottom cover member is shown) which generally provide an aesthetic appearance to the plug assembly 14. Each of the top and bottom cover members 135 includes a casing 136 and a plate 138. The plates 138 are mounted on the respective top and bottom of the plug body 98 by mounting screws (not shown) and the casings 136 enclose the cylindrical extension 108 of the plug body 98 so that the end of hose 18 and the hose retainer 118 are covered by the casings 136. Casings 136 include forward extensions 140 which act as stops to restrain the pivotal movement of the handles 122 so that the handles 122 and the cover members 135 in combination provide an aesthetic appearance of the plug assembly 14, and also prevent the metal electrical contacts 130 from contacting the plug body 98 when not in use, as shown in FIG. 5*b*. The forward extensions 140 should not adversely affect the pressed contact of the contacts 130 and 38 when the plug assembly 14 is connected to the socket assembly 12. Additionally, the bottom cover member 135 further includes a key lock 142 which is located on the inner side at the front end of the plate 138 in a position corresponding to the key way 48 in the square head 24 of the socket assembly of FIG. 3*a*, to ensure that the plug assembly 14 can be connected to the socket assembly 12 only in the correct angular orientation. The front ends of the two cover members 135 are formed to fit the square head 24 of the socket assembly 12 in order to increase the mechanical interlock between the plug assembly 14 and the socket assembly 12.

In an alternative arrangement, the handles 122 can be incorporated with either plug body 98 or cover members 135 therefore springs 134 can be omitted. The handles 122 can be deformed to open for the insertion of the plug body 98 into the socket body 22, and are urged by the resilient force resulting from the deformation to engage the cavities 36 of the socket assembly 12.

Figure 6A:
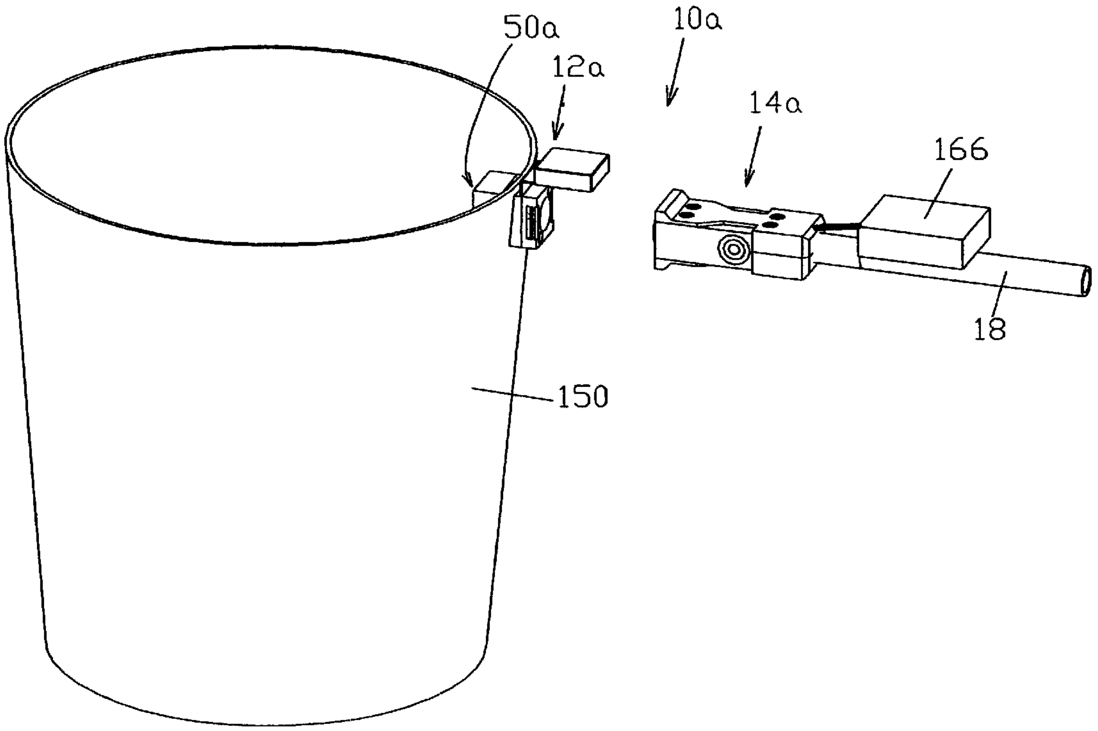
FIG. 6*a* is a perspective view showing a combined connector assembly in disconnected and connected positions according to another embodiment of the present invention.
Figure 6B:
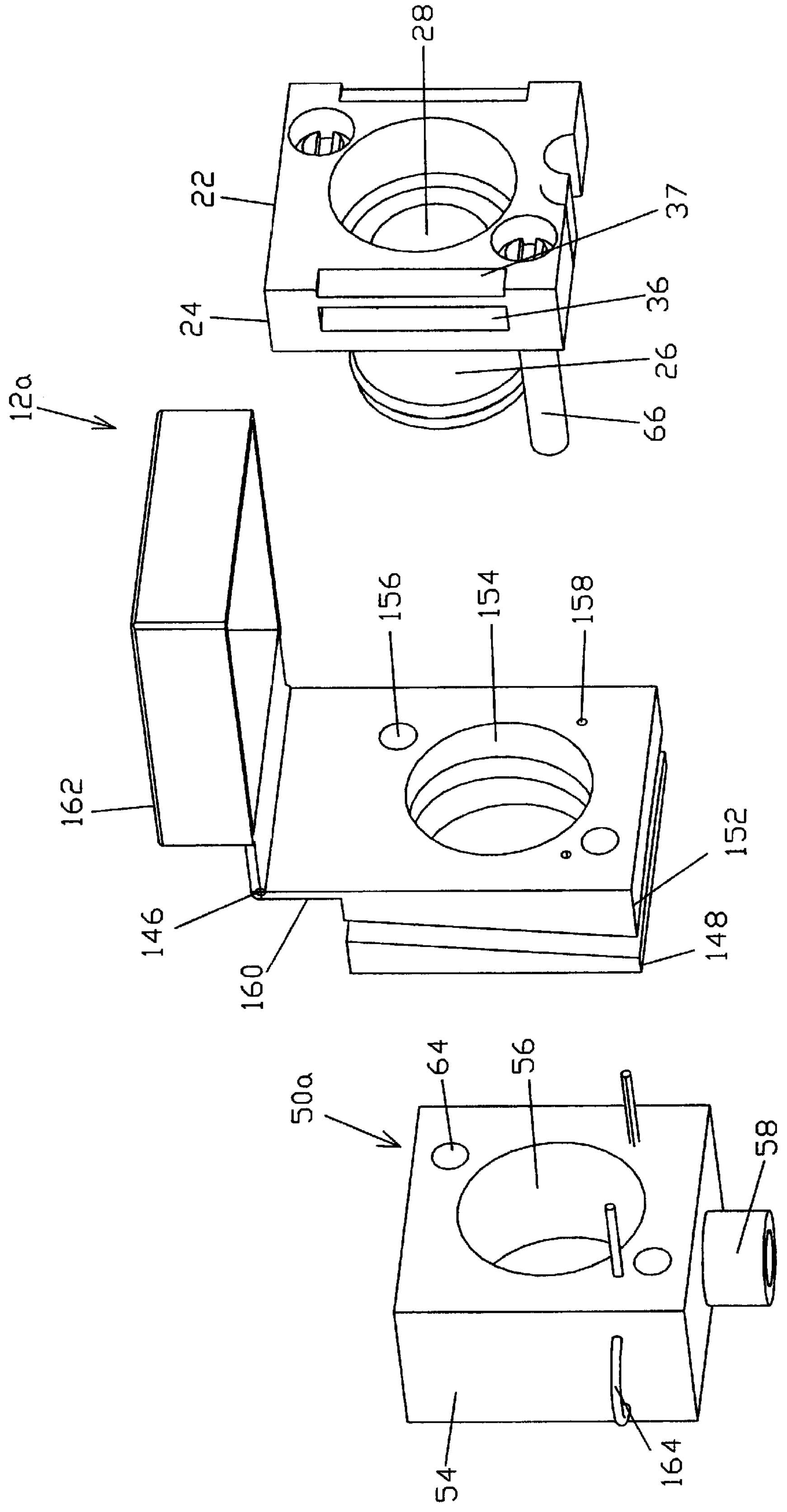
FIG. 6*b* is an exploded perspective view of the socket assembly with an internal socket assembly of the embodiment in FIG. 6*a;*
Figure 6C:
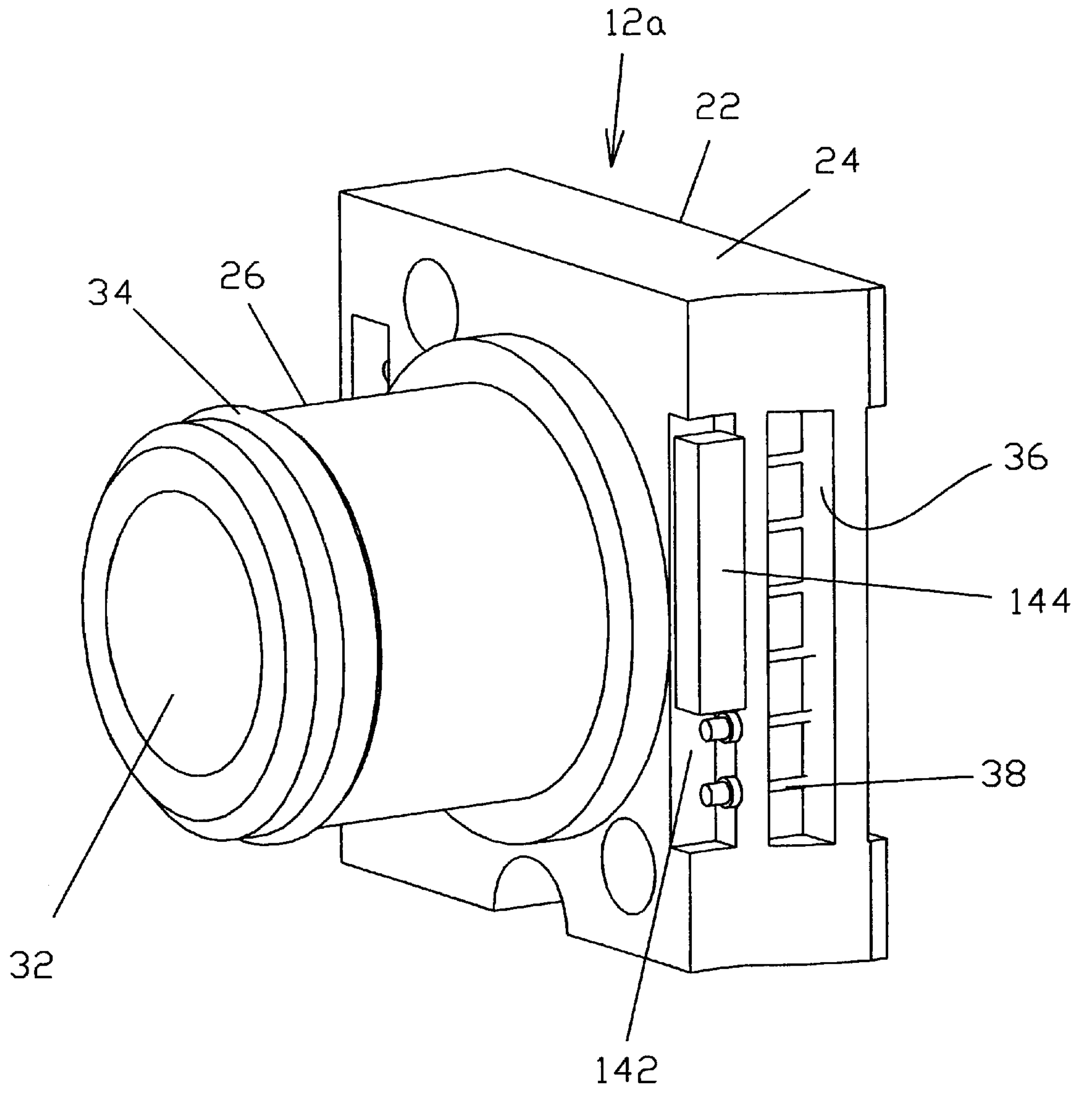
FIG. 6*c* is a rear perspective view of the socket assembly in FIG. 6*b*, showing a memory chip attached thereto.

FIGS. 6*a*–6*c* illustrate another embodiment of the present invention, in which a combined connector assembly 10*a* for both fluid and electrical connection is similar to the embodiment 10 illustrated in FIG. 1*c*, and includes socket assembly 12*a*, plug assembly 14*a* and internal socket 50*a*.

The socket assembly 12*a* is similar to the socket assembly 12 in FIG. 3*a* and similar parts and features which are indicated by similar numerals will not be redundantly described. Different from the socket assembly 12 which is used as a wall outlet, the socket assembly 12*a* is attached to an appliance such as a flower pot 150 which is used with a central watering system to water plants growing therefrom with a flood and drain watering method, as described in the Applicant's co-pending United States patent application entitled METHOD AND APPARATUS FOR WATERING POTTED PLANTS. The fluid and electrical connection between the flower pot 150 and the central watering system are established by means of the combined connector assembly 10 of FIG. 1*c* and the combined connector assembly 10*a* of the present invention.

The socket assembly 12*a* includes a socket body 22 identical to that of the socket assembly 12 of FIG. 3*a*, except that a recess 142 is provided on one side at the back of the square head 24, and a memory chip unit 144 is accommodated therein which is electrically connected to a number of metal electrical contacts 38 within the cavities 36. The memory chip unit 144 includes identification code, type code and/or other information data for that particular flower pot 150 to which the socket assembly 12*a* is attached. Thus, when that flower pot 150 is connected to the central watering system, the system can automatically identify that flower pot 150 and retrieve information such as the size of the flower pot for use in programming a watering process for that flower pot 150.

In order to attach the socket assembly 12*a* to the curved wall of the flower pot 150, a two-piece spacer 146 is provided which includes an inner member 148 and an outer member 152. The inside surfaces of the inner and outer members 148, 152 are formed to match the curved shape of the flower pot 150. Both inner and outer members 148, 152 have a hole 154 for the nozzle 26, holes 156 for the screws 66, and holes 158 for wires (not shown) to pass through. The outer member 152 has an extension 160 to which a hood 162 is pivotally attached.

The internal socket 50*a* includes a square body 54 similar to that of internal socket 50, for receiving the nozzle 26 of socket assembly 12 of FIG. 2, but does not support the socket assembly 12*a*. Instead, socket assembly 12*a* and internal socket 50*a* are both supported by the two-piece spacer 146. The inner member 148 and outer member 152 of spacer 146 are placed on the opposite sides of the wall of the flower pot 150 and are tightly pressed together by mounting screws 66 passing through the holes 156 of the spacer 146 and interconnecting the socket assembly 12*a* with the inner socket 50*a*. A water pipe (not shown) is connected to the extension 58 of the internal socket 50*a* and extends downwards to the bottom of the flower pot 150 to supply water into and remove water from the flower pot 150. Thus, the combination of spacer 146 and internal socket 50*a* provides an adapter function so that the socket assembly 12*a* can be attached to various appliances or wall structures with only changes of the internal socket 50*a* and spacer 146.

When a water level detector is required to be mounted in the flower pot 150 at the top thereof, the water level detector can be incorporated into the internal socket 50*a* by exposing probes 164 on the opposite sides of the square body 54 of internal socket 50*a* and connecting those probes 164 electrically to the metal electrical contacts 38 in the cavities 36 of the socket assembly 12*a*. All electrical conductors including those connecting other sensors (not shown) in the flower pot 150 will pass through the holes 158 to be connected to the metal electrical contacts 38 in the cavities 36 of the socket assembly 12*a*. It should be noted that corresponding openings (not shown) should be made through the flower pot wall in order to allow the nozzle 26, screws 66 and these electrical conductors to pass therethrough. The hood 162 is positioned over the squared head 24 of the socket assembly when the socket assembly is not in use in order to protect the contacts 38 from corrosion and prevent children from dropping in foreign objects such as stones, as well to make the socket assembly 12*a* more aesthetically pleasing.

The plug assembly 14*a* is identical to the plug assembly 14 of FIG. 1*c* and will not therefore be redundantly described.

A remote control 166 which is used with the central watering system, can be conveniently connected to the plug assembly 14*a* if a telephone socket is incorporated into the rear end of the plug assembly 14*a*, which is well known in the art. Thus a user can operate the central watering system from a position near the plants to be watered.

The plug assembly 14*a* and the plug assembly 14 of FIG. 1*c* are attached to opposite ends of the hose 18. It should be noted that both ends of the hose 18 should be properly closed after the hose 18 is used and is disconnected at either or both ends. If either end of hose 18 is left open and when hose 18 is moved around, water remaining in the hose 18 could run out, which is not acceptable, especially for indoor applications. End connectors with built-in valves which are available in the market and are used for ordinary water hoses to prevent water from running out are not adequate for use with hose 18 which is connected to the central watering system to supply and withdraw water through the same hose 18.

Figure 7A:
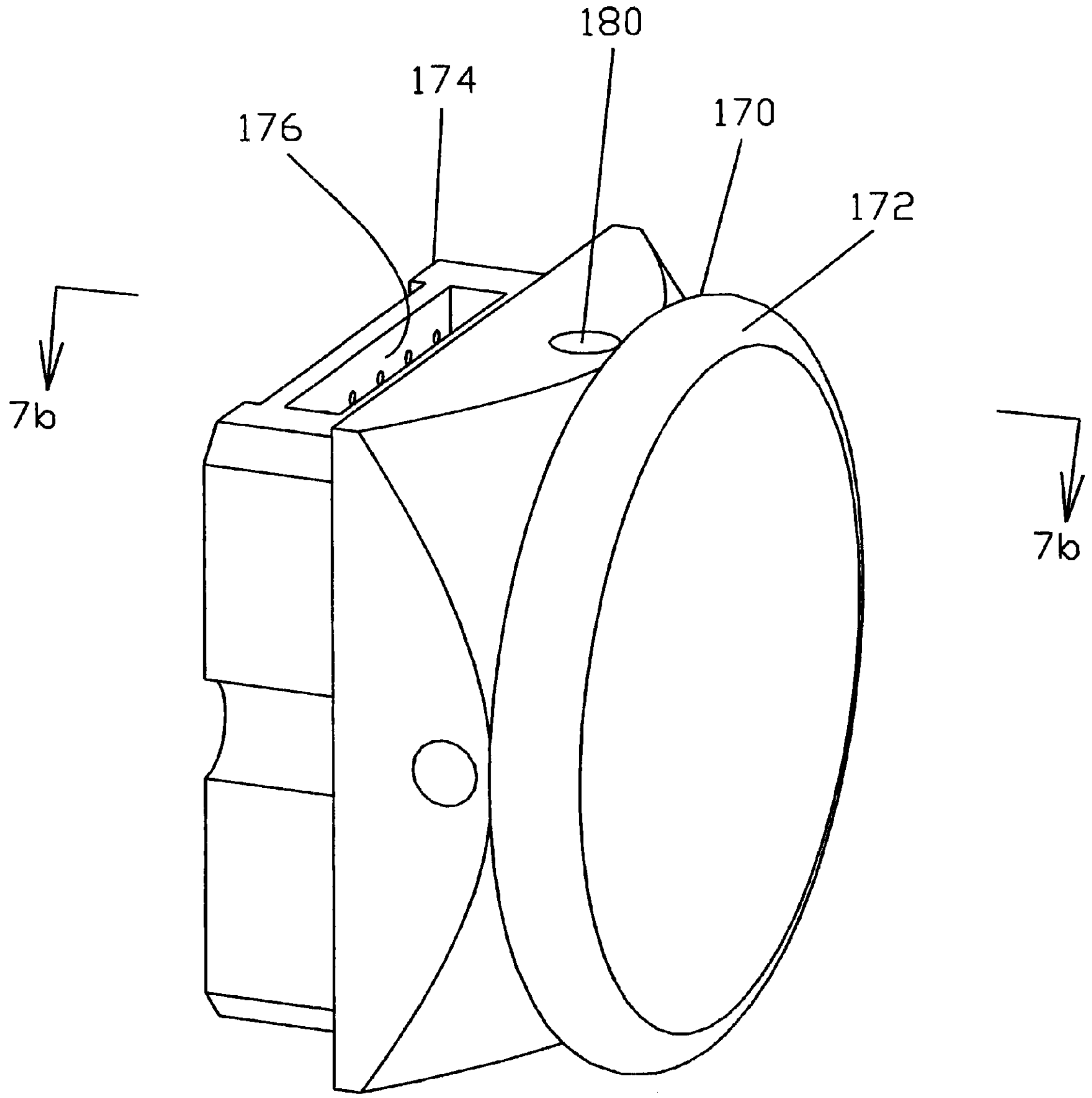
FIG. 7*a* is perspective view of a cover assembly for the plug assembly in FIG. 6*a;*
Figure 7B:
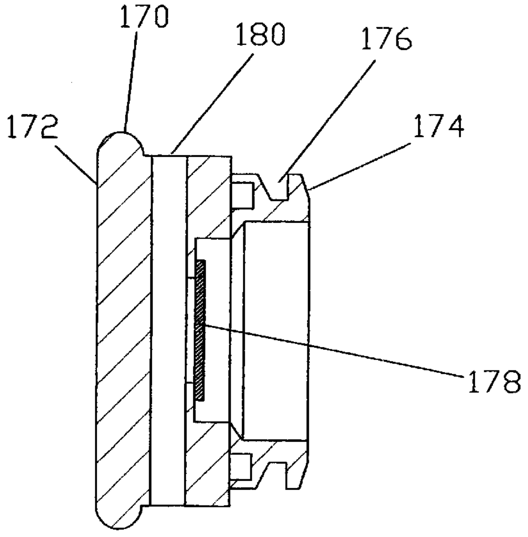
FIGS. 7*b* and 7*c* are cross-sectional views taken along line 7*b*—7*b* of FIG. 7*a*, showing a one-way valve in a closed position and in an open position respectively.
Figure 7C:
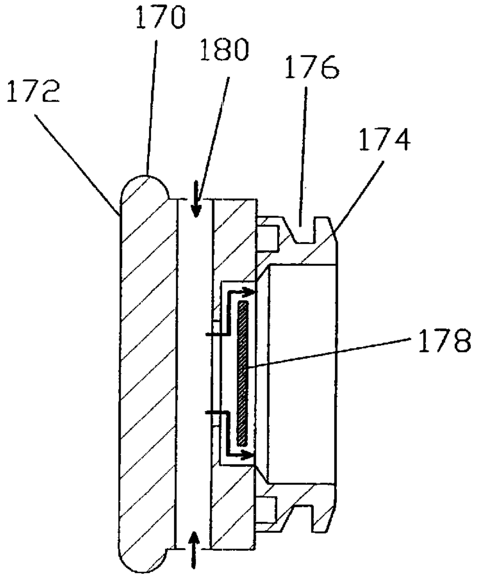

In FIGS. 7*a*–7*c*, a simple plug 170 is provided. The plug 170 is cylindrical at one end 172 in order fit into the opening 112 of the nozzle 106 of plug assembly 14 of FIG. 5*b*, and is formed in a square shape at its other end 174 with two cavities 176 for receiving the protrusions 128 of the handles 122 of the plug assembly 14, so that the plug 170 cannot be accidentally removed from the plug assembly 14*a*. A one-way valve 178 is provided within the plug 170 which, under water pressure, is closed to prevent water remaining in the hose 18 from running out thereof as shown in FIG. 7*b*, and which permits air to flow through orifices 180 while the other end of the hose 18 is being connected to the central watering system which is generating a vacuum action to remove any water remaining in the hose.

A number of devices have been developed that require supply and drain of water through a single hose. A hose can be permanently attached to those devices or can be attached through the combined connector assembly for fluid and electrical connection, in accordance with the present invention. The socket assembly can be part of an appliance, such as the flower pot 150 of FIG. 6*a*.

Figure 8:
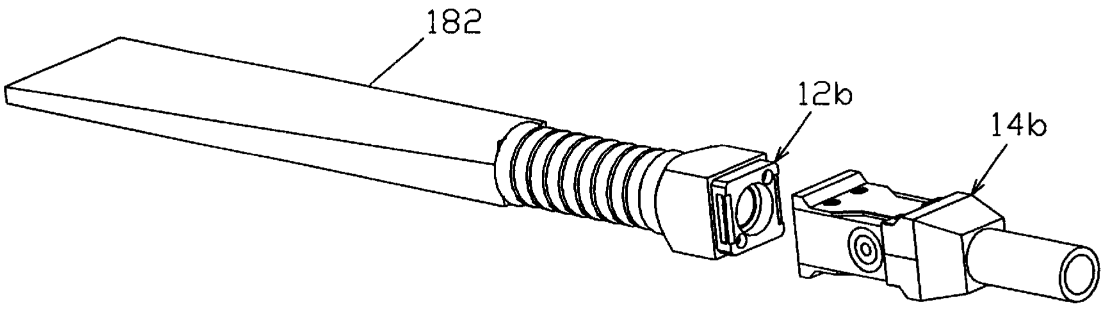
FIG. 8 is a perspective view showing a further embodiment of the combined connector assembly of the present invention.

FIG. 8 illustrates a further embodiment of the present invention in which the socket assembly 12*b* is incorporated into a hose end attachment 182, for watering potted house plants and removing the excess water from a saucer placed under a flower pot which has a drain hole in the bottom thereof. The socket assembly 12*b* is similar to socket assembly 12 but does not include the internal socket 50 and the spacer 70 of FIG. 2*a*. The socket 12*b* is connected to the plug assembly 14*b* which is identical to plug assembly 14 of FIG. 1*c*.

The combined connector assembly for fluid and electrical connection of the present invention can be used not only to connect an appliance to a water supply and drain system, such as the central watering system, but can also connect an appliance to other systems, for example, connecting a vacuum cleaning device to a central vacuum cleaning system. It is to be understood that the present invention is not limited to the embodiments described and shown herein. Modifications and improvements to the above-described embodiments of the present invention may become apparent to those skilled in the art. The foregoing description is intended to be exemplary rather than limiting. The scope of the invention is therefore intended to be limited solely by the scope of the appended claims.

I claim:

1. A combined connector assembly for fluid and electrical connection comprising:

a socket assembly including a socket body having a first end, a second end, a fluid passage extending through the socket body and forming first and second openings in the respective first and second ends, and at least one cavity at a side thereof, a plurality of metal contacts affixed within the cavity of the socket assembly and adapted to be connected to a first external circuit;

a plug assembly including a plug body having a first end, a second end, and a fluid passage extending through the plug body and forming first and second openings in the respective first and second ends, the first end being detachably sealingly received in the first opening of the socket body, thereby selectively providing fluid communication of the fluid passage of the socket body with the fluid passage of the plug body, the plug body including at least one lock member having an inwardly extending protrusion at an end thereof;

a plurality of metal contacts positioned on the protrusion of the lock member and adapted to be connected to a second external circuit, the contacts on the protrusion being pressed in contact with the contacts within the cavity when the protrusion of the lock member under a resilient force is engaged in the cavity of the socket body.

2. A combined connector assembly as claimed in claim 1 further comprising an adapter assembly connected to the second end of the socket body, and being adapted to be affixed to various structures for supporting the socket assembly and providing fluid communication of the fluid passage of the socket body with an external fluid pipe.

3. A combined connector assembly as claimed in claim 1 further comprising a first cover assembly for sealingly closing the first opening of the socket body and covering the metal contacts of the socket assembly when the plug assembly is detached from the socket assembly.

4. A combined connector assembly as claimed in claim 3 wherein the first cover assembly comprises a lock member for selectively engaging the first part of the interlocking means affixed to the socket assembly.

5. A combined connection assembly as claimed in claim 1 further comprising a second cover assembly for sealingly closing the first opening of the plug body when the plug assembly is detached from the socket assembly.

6. A combined connection assembly as claimed in claim 5 wherein the second cover assembly comprises a lock member for engaging the second part of the interlocking means positioned on the plug assembly, and a one-way valve to permit inward fluid flow and inhibit outward fluid flow.

7. A combined connector assembly as claimed in claim 5 wherein the plug body comprises a cylindrical nozzle at the respective first and second ends thereof, the first nozzle being provided with sealing device and the first opening in the first end of the socket body being shaped and sized corresponding to the cylindrical nozzle at the first end of the plug body, whereby the nozzle at the first end of the plug body is detachably and sealing received in the first opening.

8. for fluid and electrical connection comprising:

a socket assembly including a socket body having a first end, a second end, and a fluid passage extending through the socket body and forming first and second openings in the respective first and second ends, the socket body including a cylindrical body at the second end thereof and a head at the first end thereof, the head including an end surface and two opposed side surfaces, each side surface having a cavity extending parallel to the end surface, a plurality of metal contacts affixed to the socket assembly and adapted to be connected to a first external circuit;

a plug assembly including a plug body having a first end, a second end, and a fluid passage extending through the plug body and forming first and second openings in the respective first and second ends, the first end being detachably sealingly received in the first opening of the socket body, thereby selectively providing fluid communication of the fluid passage of the socket body with the fluid passage of the plug body;

a plurality of metal contacts positioned on the plug assembly and adapted to be connected to a second external circuit; and means for releasably interlocking the plug assembly and the socket assembly in the connected position, the means including a first part incorporated with the metal contacts affixed to the socket assembly and a second part incorporated with the metal contacts positioned on the plug assembly, the contacts of the socket assembly and the contacts of the plug assembly being in contact only when the first part engages the second part.

9. A combined connector assembly as claimed in claim 8 wherein the metal contacts of the socket assembly are affixed within the respective cavities.

10. A combined connector assembly as claimed in claim 9 wherein the plug body comprises a pair of lock members attached to opposed sides of the plug body respectively, a protrusion laterally and inwardly extending from an end of each lock member being releasably engaged under a resilient force in a corresponding one of the cavities of the socket body.

11. A combined connector assembly as claimed in claim 10 wherein the metal contacts of the plug assembly are positioned on the respective protrusions.

12. A combined connector assembly as claimed in claim 10 wherein each lock member comprises a spring and an elongate handle pivotally mounted at a middle portion thereof to the plug body, the protrusion located at an end of the handle being urged by the spring into the cavities and the metal contacts on the protrusion being pressed in contact with the metal contacts within the cavity, and the protrusion moving away from the cavity when the handle pivots under an external force against the spring to permit the first end of the plug body to be removed from the first opening of the socket body.

13. A combined connector assembly as claimed in claim 9 further comprising a first cover plug for sealingly closing the first opening of the socket body when the plug assembly is detached from the socket assembly.

14. A combined connector assembly as claimed in claim 13 wherein the cover plug further comprises spring means, two wing members pivotally attached to opposed sides of the cover plug, and two lock members affixed to the respective wing members, whereby the wing members are urged by the spring means to pivot laterally towards the head of the socket body until the lock members are engaged into the respective cavities of the head of the socket body when the plug assembly is detached from the socket assembly and the cover plug closes the first opening of the socket body.

15. A combined connector assembly as claimed in claim 14 wherein the cover plug further comprises a plurality of light indicators, a plurality at metal contacts positioned on the respective lock members and an electrical circuit connecting the metal contacts and the light indicators such that the metal contacts of the cover plug are pressed into contact with the metal contacts within the respective cavities, and thereby the light indicators are controlled by an external circuit to be selectively illuminated when the plug assembly is replaced with the cover plug.

16. A combined connector assembly as claimed in claim 8 further comprising means for assuring a desired angular relationship between the socket assembly and the plug assembly for the connection therebetween.

17. A combined connector assembly as claimed in claim 8 wherein the socket assembly comprises a memory chip adapted to be connected to an external circuit through the metal contacts of the socket assembly.

18. A combined connector assembly as claimed in claim 8 further comprising an internal socket connected to the cylindrical body of the socket assembly and adapted to be affixed in a wall and to be connected to an external fluid pipe in order to provide support to the socket assembly and fluid communication between the socket assembly and the external fluid pipe.

19. A combined connector assembly as claimed in claim 18 wherein the socket assembly comprises a spacer positioned between the head of the socket body and the internal socket.

* * * * *